United States Patent [19]

Onitsuka

[11] Patent Number: 5,513,792
[45] Date of Patent: May 7, 1996

[54] BONDING APPARATUS

[75] Inventor: Yasuto Onitsuka, Fukuoka, Japan

[73] Assignee: Matsushita Electric Industrial Co., Ltd., Osaka, Japan

[21] Appl. No.: 341,095

[22] Filed: Nov. 17, 1994

[30] Foreign Application Priority Data

Nov. 17, 1993 [JP] Japan ................. 5-288024

[51] Int. Cl.⁶ ................. H01L 21/60
[52] U.S. Cl. ................. 228/180.22; 228/6.2; 228/13; 228/214; 29/33 M; 29/827; 29/884; 454/57
[58] Field of Search ................. 228/5.5, 6.2, 13, 228/44.7, 49.5, 106, 180.22, 214; 29/33 M, 827, 884; 454/187, 56, 57

[56] References Cited

U.S. PATENT DOCUMENTS

| | | | |
|---|---|---|---|
| 3,696,985 | 10/1972 | Herring et al. | 228/106 |
| 4,890,780 | 1/1990 | Mimata et al. | 228/4.5 |
| 4,944,850 | 7/1990 | Dion | 29/827 |
| 5,065,504 | 11/1991 | Olla | 29/827 |
| 5,351,876 | 10/1994 | Belcher et al. | 228/180.22 |

*Primary Examiner*—Samuel M. Heinrich
*Attorney, Agent, or Firm*—Willian Brinks Hofer Gilson & Lione

[57] ABSTRACT

An outer-lead bonding apparatus according to the present invention comprises:

(1) a punching die to stamp out chips from a film carrier tape,
(2) a mounter to mount TAB chips on a substrate,
(3) a first cover to enclose the mounter,
(4) a second cover to enclose the punching die,
(5) a pressure regulator to supply higher air pressure than outer air into inside space of the first cover, and
(6) a exhaust to exhaust air from inside space of the second covering means. The outer-lead bonding apparatus of this invention keeps the environment around the mounter clean with air supplied from a pressure regulator and also by exhausting the air polluted by the punching operation through the exhaust. Neither products nor outer environment is thus contaminated.

8 Claims, 6 Drawing Sheets

BONDING APPARATUS

BACKGROUND OF THE INVENTION

The present invention relates to an outer-lead bonding apparatus accommodating the Tape Automated Bonding method (herein after called "TAB method"). With the TAB method, electronic components (hereinafter called "chips") formed on a film carrier tape are punched out with a punching die. The punched chips (hereinafter called "TAB chips") are then bonded on a substrate by using an outer-lead bonding apparatus.

A clean environment is needed for handling some substrates, such as for a liquid crystal display. It is therefore desirable to create an outer-lead bonding apparatus which can keep the environment around substrates clean. Further, there is a need for an outer-lead bonding apparatus which can be used in a clean room.

The conventional type of outer-lead bonding apparatus scatters dust and scraps of tape when it punches chips, and pollutes the environment inside the apparatus as well as outside. A clean room thus cannot accommodate a conventional apparatus.

An outer-lead bonding apparatus according to this invention can keep products clean by connecting TAB chips with a substrate in a clean environment. Since this apparatus also can keep the outer environment clean, it can be used in a clean room.

SUMMARY OF THE INVENTION

An outer-lead bonding apparatus according to the invention comprises:

(1) a punching die to stamp chips from a film carrier tape, (2) a mounter to mount TAB chips on a substrate, (3) a first cover to enclose the mounter, (4) a second cover to enclose the punching die, (5) a pressure regulator to supply higher air pressure than outer air into the inside space of the first cover, and (6) an exhaust to exhaust air from the inside space of the second cover.

The outer-lead bonding apparatus according to the invention can maintain the environment around the mounter clean with supplied air from the pressure regulator and also by exhausting the air polluted by the punching operation through the exhaust. Thus, neither the products nor the outer environment is contaminated.

EXEMPLARY EMBODIMENT

Figure 1:
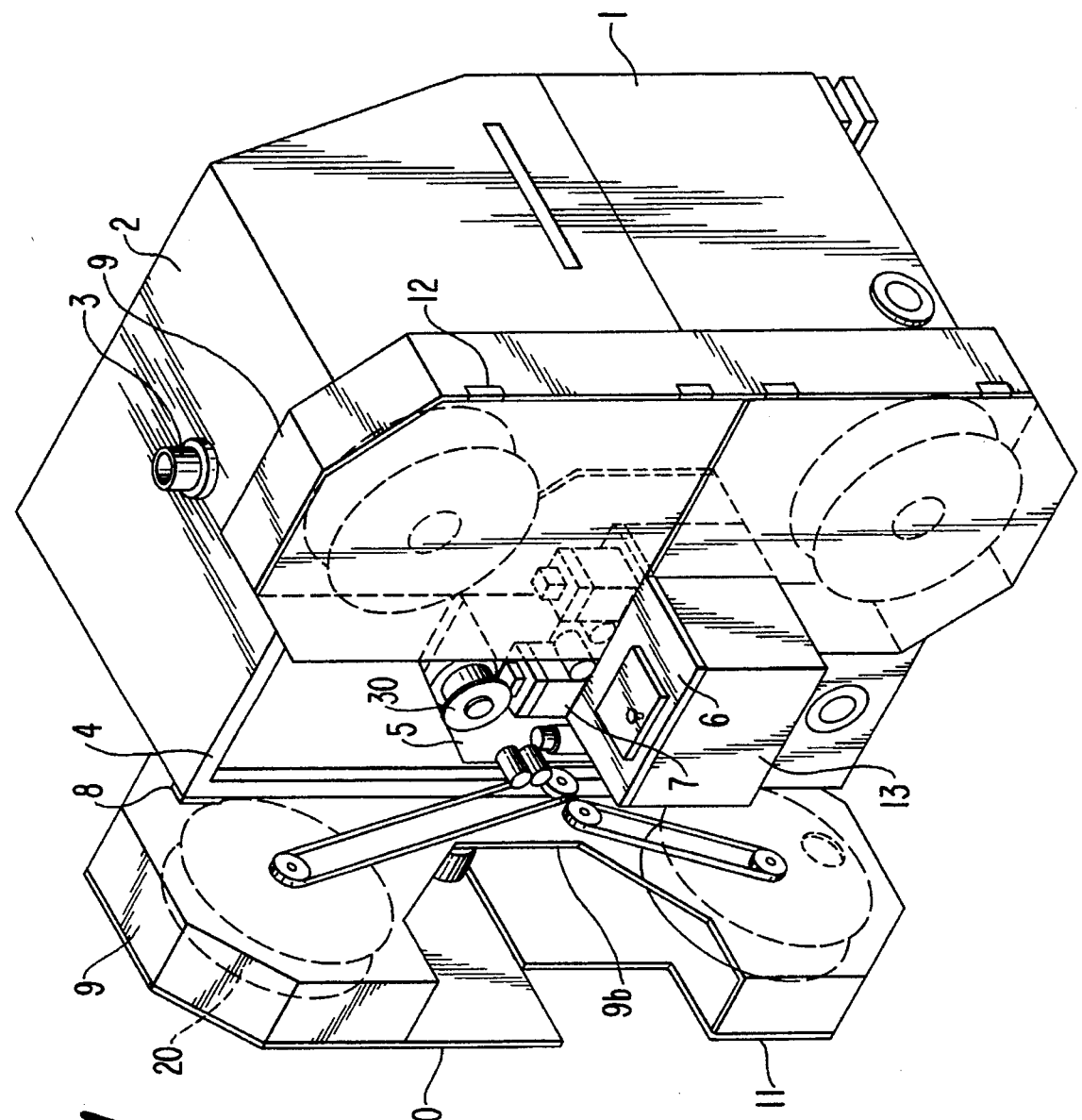
FIG. 1 and FIG. 2 are oblique projection views of an outer-lead bonding apparatus of this invention.
Figure 2:
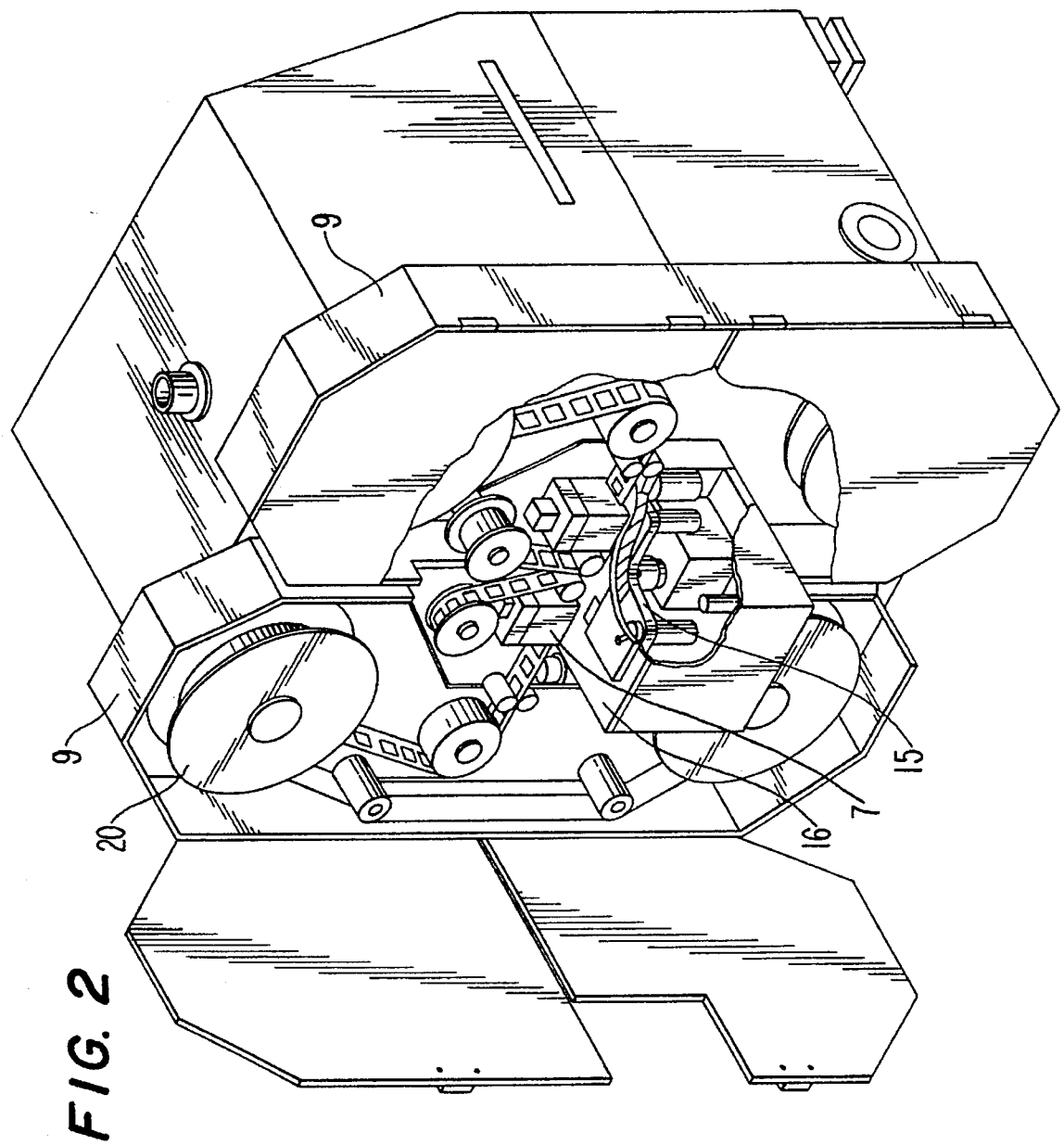

The preferred embodiment of the invention is illustrated in FIG. 1 and FIG. 2. In FIG. 1, a body cover 2 having a front frame 4 covers the upper space of a base 1. An air intake 3 draws the pressured air into the space inside of a body cover 2. A pair of reel covers 9 are mounted on the front frame 4 with a hinge 8 so that the reel covers 9 can open or close freely.

In FIG. 1, the reel cover 9 on the right side is closed, and the reel cover 9 on the left side is opened. When the equipment in the body cover 2 requires a maintenance work, or when reel 20 or 30 requires maintenance, both reel covers are opened.

A notch 9b of the reel cover 9 prevents interference between the reel cover 9 and a partition 5 when the reel cover is closed. An upper door 10 and a lower door 11 are mounted on the front face of the reel cover 9 with a hinge 12. When the equipment in the reel cover 9 requires maintenance, the upper door 10 or lower door 11 is opened. A die table 6 is fixed on the partition 5, and a punching die 7 is mounted on the die table. A housing 13, fixed on the base 1, supports the die table 6.

Figure 3:
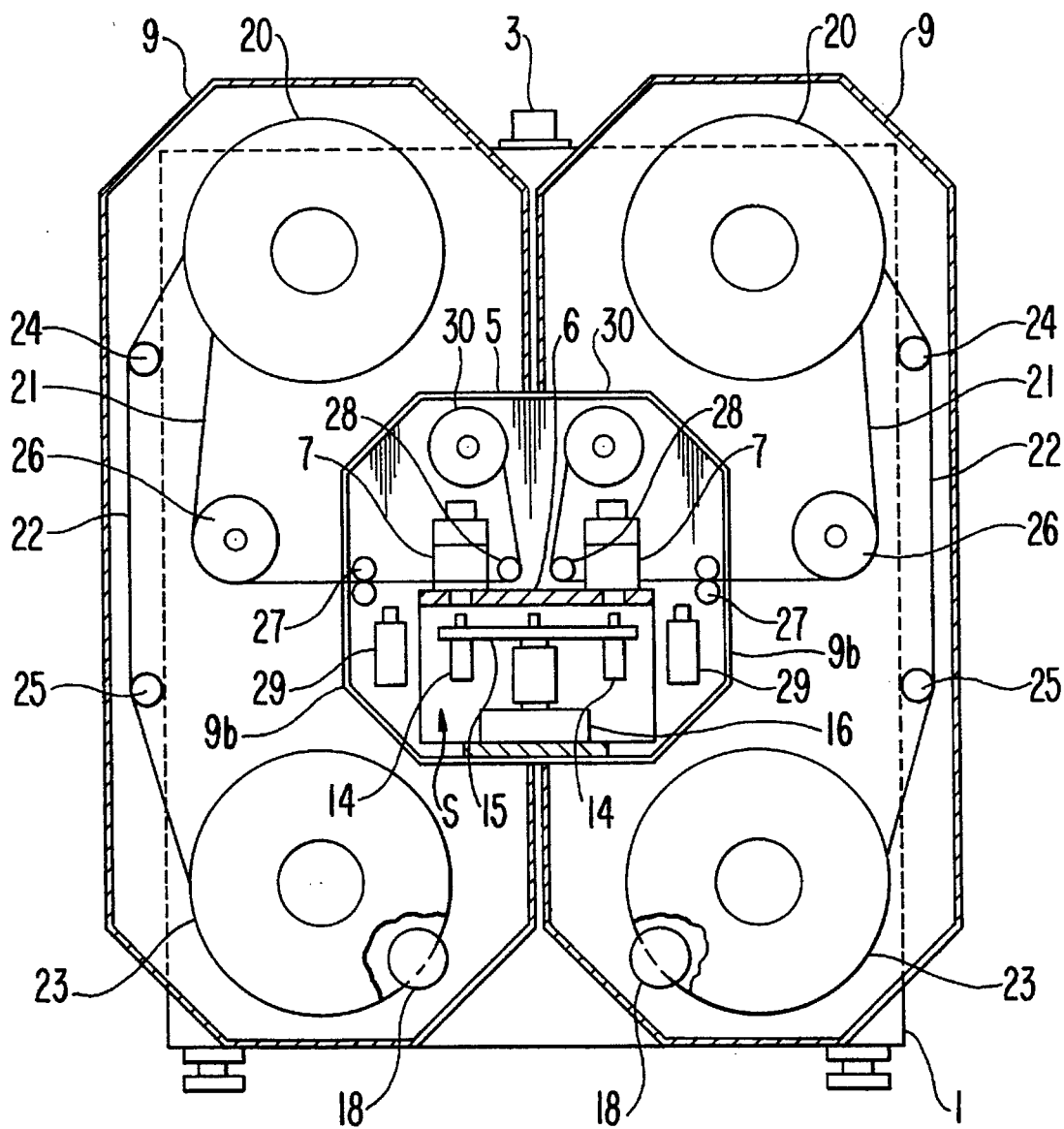
FIG. 3 shows the inside of a reel cover of this invention.
Figure 4:
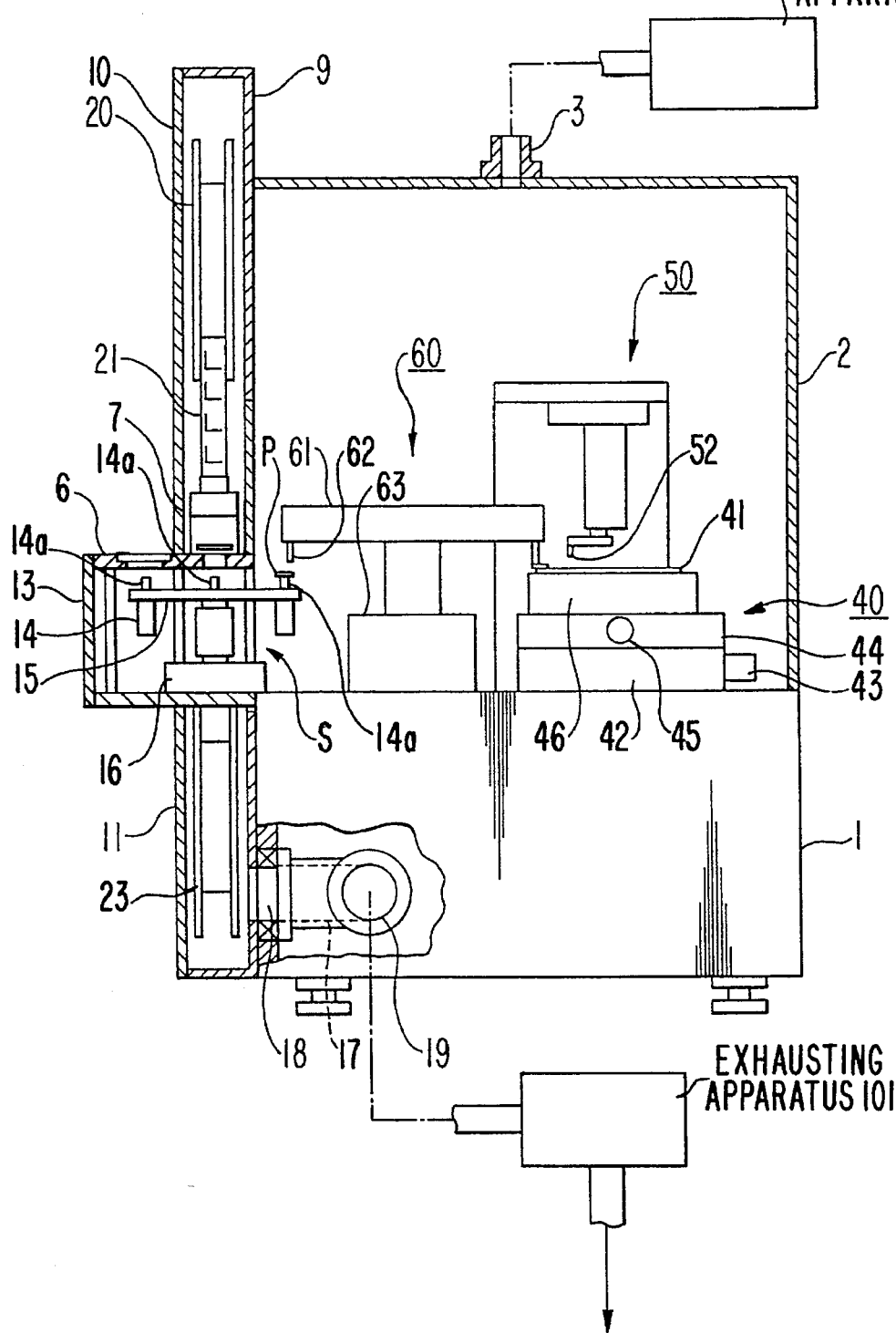
FIG. 4 shows the structure of the preferred embodiment of this invention.

As shown in FIGS. 3 and 4, the housing 13 and die table 6 protrude from a window S of the partition 5. As shown in FIGS. 2 and 4, a take-out, having a cross shaped turn table 15 having take-out heads 14 on each tip of the cross and a driver 16 for the turn table, is stored in the housing 13.

In operation, the turn table 15 rotates around the driver 16 with a stepping movement. Both reel covers 9 are closed as shown in FIG. 2, then a first inside space, enclosed by the body cover 2, housing 13, reel cover 9, and partition 5, is formed as shown in FIG. 4. Further, when the doors 10 and 11 of the reel cover 9 are closed, a second space, enclosed by the partition 5, die table 6, housing 13, reel cover 9 and doors 10 and 11, is formed as shown in the cut-away portion of FIG. 2. The punching die 7 is inside of the second space.

Turning now to FIG. 4, polluted air, generated by the punching operation, is passed through an exhaust air intake 18, exhaust duct 17 and exhaust output 19 to an exhaust apparatus 101 where the air is first purified and then exhausted. When the exhaust apparatus 101 is physically separated from the rest of the equipment, the exhausted air does not pollute the air around the bonding apparatus.

A pressure apparatus 100 sends purified air with a higher pressure than that of the outer space into the first space. In this case, since the air pressure of the inside of the first space in higher than that of outside space, air will not flow into the inside space from outside space. The air inside of the first space is thus not polluted even if the air of the outside space is polluted. If the air of outside space is kept clean, for example, when a bonding apparatus is placed in a clean room, the pressure apparatus can be omitted.

FIG. 3 shows the inside of the reel covers when the reel covers 9 are closed as shown in FIG. 2. Each reel cover has the same inside structure.

A film carrier tape 21 having chips on it and interlayer paper 22 are pulled out separately from a supply reel 20. The interlayer paper 22 is guided by guide rollers 24 and 25 and taken up by a reel 23. The film carrier tape 21 is sent to the punching die 7 by being provided appropriate tension with a tension roller 26. The reels 20 and 23 are rotatively held on the reel covers, and are driven by a well-known driver, such as an electric motor (not shown).

The supply reel 20 is at a higher position than the punching die 7. The film carrier tape 21, that has not yet been punched, is at the same height or above the punching die 7. Even when dust is generated by the punching operation, these locations help reduce the possibility of dust adhering to chips on the film carrier tape 21.

Sprockets 27 and 28 transmit the film carrier tape 21 with a stepping movement. A camera 29, mounted on the partition 5, monitors the position of the film carrier tape 21.

The film carrier tape 21, after being punched by the punching die 7, is taken up by a reel 30. The sprockets 27, 28 and the reel 30 are rotatively held on the partition 5, and driven by a well-known driver, such as an electric motor (not shown).

TAB chips, stamped from the film carrier tape 21, are taken from bottom of the punching die 7 with the take-out head 14. As mentioned above, the take-out head 14 is mounted on each tip of the cross-shaped turn table 15, and the turn table 15 is rotated with a stepping movement around the driver 16 for the turn table 15.

Figure 5:
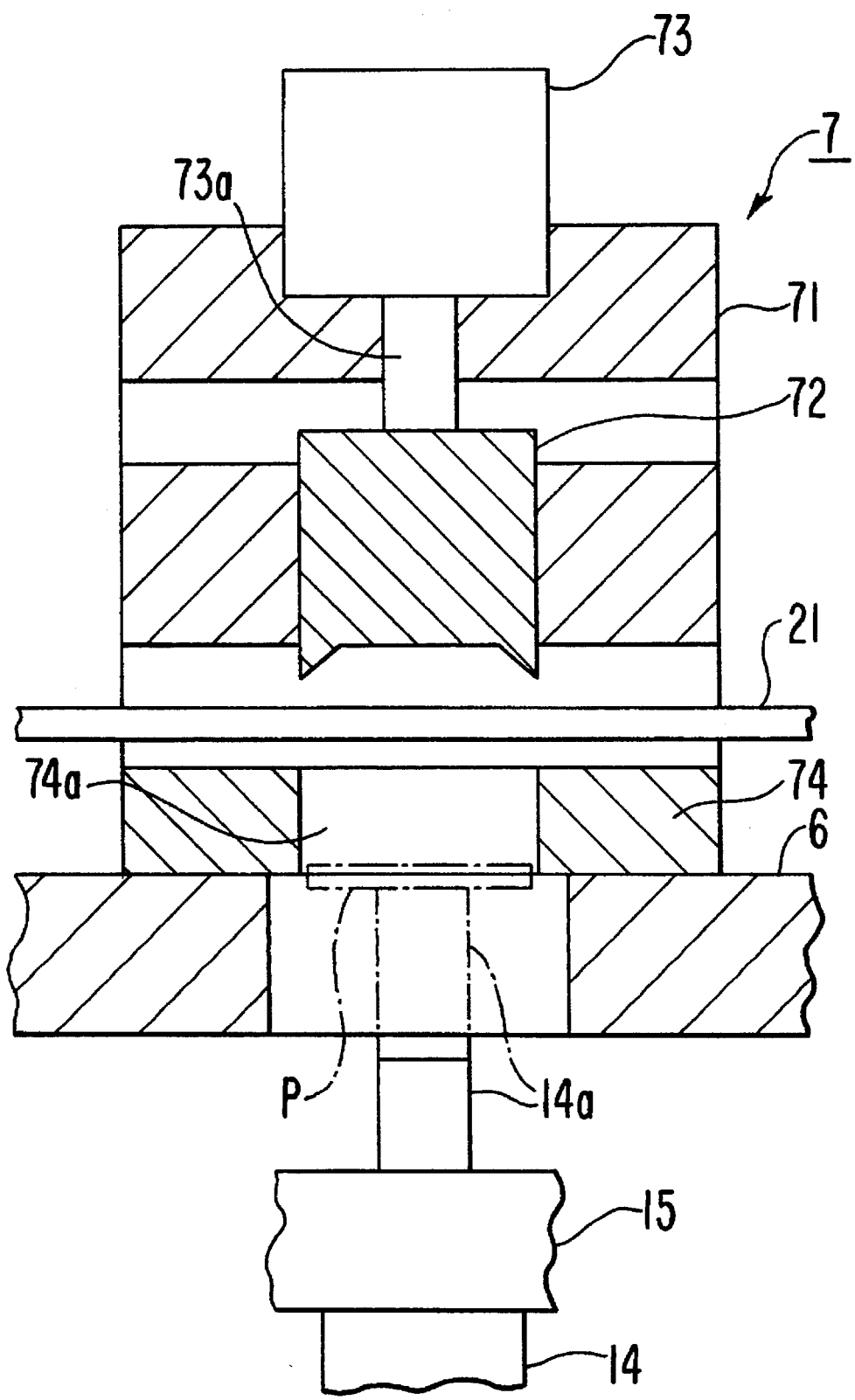
FIG. 5 shows a structure of a punching die.

FIG. 5 illustrates the punching and removing of TAB chips. A cylinder 73 having a rod 73a is fixed on a frame 71. An upper cutting die 72 is mounted on the rod 73a, and the cylinder 73 drives it up and down. A lower cutting die 74 has a through hole 74a corresponding to the upper cutting die 72. The take-out head 14 has a vacuum sucking nozzle 14a that is movable up and down.

The punching operation includes the following steps:

(1) The take-out head 14 raises the nozzle 14a into the through hole 74a as shown with broken lines and has it wait at the bottom of the through hole 74a.

(2) The upper cutting die 72 lowers and punches TAB chips P into the through hole 74a from the film carrier tape 21.

(3) The punched TAB chips P are sucked by the nozzle 14a.

(4) The nozzle 14a lowers, and TAB chips P as well as the nozzle 14a goes out from the through hole 74a.

As mentioned above, the take-out head 14 removes TAB chips P under the cutting die 7. Then as shown in FIG. 4, the take-out head 14, sucking TAB chips, goes out from the housing 13 by rotation of the turn table 15. A transfer table 60 has a rotary table 61, transfer head 62 and driver 63. TAB chips P are transferred from the take-out head 14 to a transfer head 62 by turning off the vacuum suction of the take-out head 14 and turning on the vacuum suction of the transfer head 62. Finally, TAB chips P are mounted on the substrate 41 and placed on the positioner 40 by the rotation of the driver 63. The positioner 40 is an X-Y table having a base 42, a Y table motor 43, a Y table 44, an X table motor 45, and an X table 46. A press-bonding head 52 of a press-bonder 50 press-bonds TAB chips P to the substrate.

Figure 6:
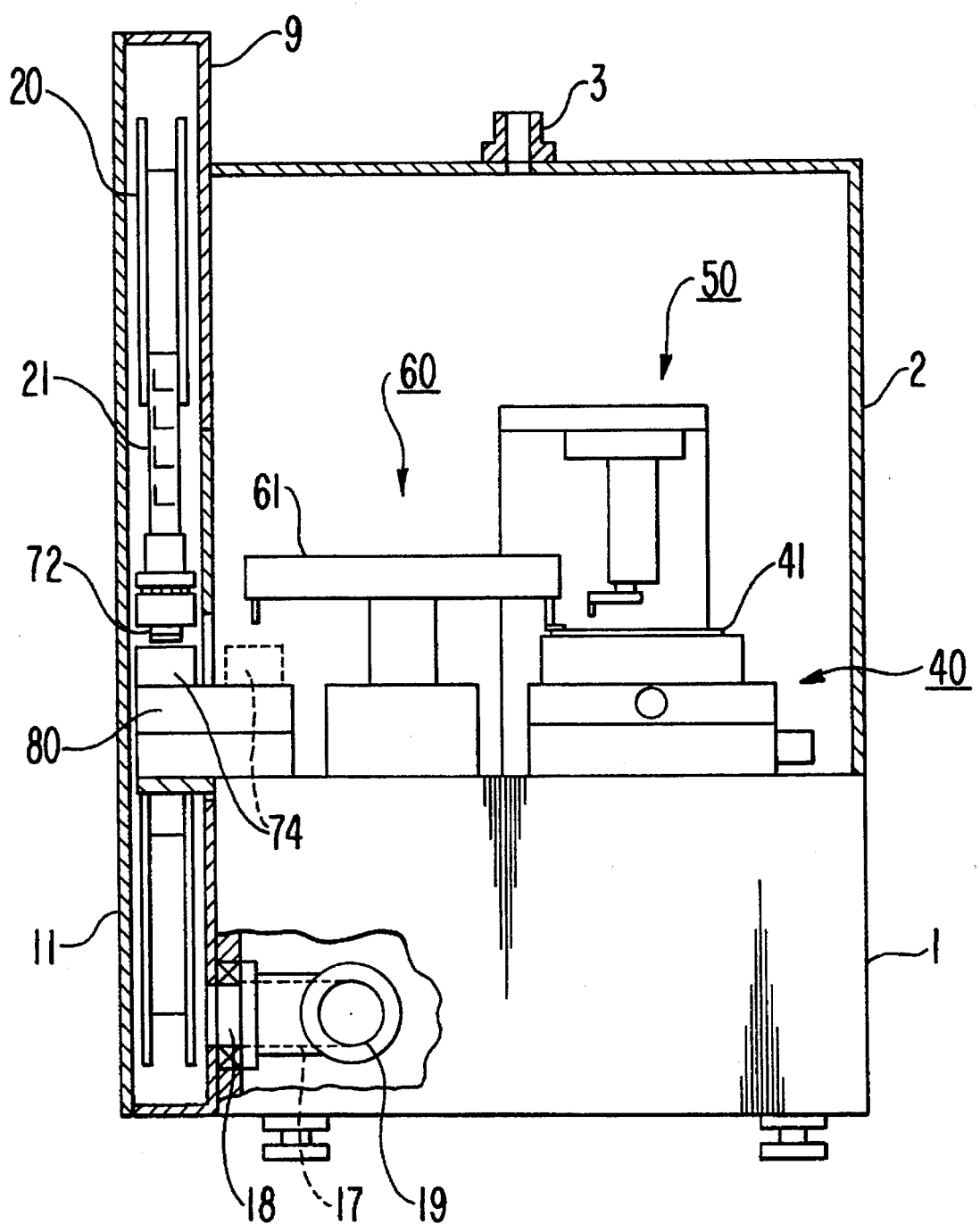
FIG. 6 shows an alternative embodiment of this invention.

FIG. 6 shows an alternative embodiment of the invention. This embodiment differs from the first embodiment because it does not have a take-out means. Thus, like parts operate in the same fashion as in the first embodiment. Therefore, only the differences in operation are described below.

The lower cutting die 74 is on a movable table 80. The through hole 74a of the lower cutting die 74 is stopped up with the movable table 80. The lower cutting die 74 can move, due to the movement of the movable table 80, between a position corresponding to the upper cutting die 72 shown with a solid line and a position under the transfer head 61 shown with a broken line. The lower cutting die 74 moves together with TAB chips from the position corresponding to the upper cutting die to the position under the transfer head 61 wherein the transfer head 61 sucks the TAB chips from inside of the lower cutting die 74.

Of course, it should be understood, that a wide range of changes and modifications can be made to the preferred embodiments described above. It is therefore intended that the foregoing detailed description be regarded as illustrative rather than limiting and that it be understood that it is the following claims, including all equivalents, which are intended to define the scope of this invention.

What is claimed is:

1. An outer-lead bonding apparatus comprising:

a punching die to stamp chips from a film carrier tape;
   a mounter to mount a TAB chip onto a substrate;
   a cover to enclose the punching die; and
   an exhaust to exhaust air from an inside space of the cover.

2. An outer-lead bonding apparatus of claim 1, wherein said mounter comprises:

a take-out head to take the TAB chip to the outside of the cover;
   a transfer table to transfer the TAB chip onto said substrate; and
   a pressure bonder to pressure bond the transferred TAB chip onto said substrate.

3. An outer-lead bonding apparatus of claim 1, wherein said mounter comprises:

a mover to move a lower die of the punching die back and forth between inside and outside of a covering means;
   a transferor on the outside of the cover to transfer the TAB chips in the lower die of the punching means which is moved to the outside of the cover from the inside; and
   a pressure bonder to pressure bond the transferred TAB chips onto the substrate.

4. An outer-lead bonding apparatus comprising:

a punching die to stamp chips from a film carrier tape;
   a mounter to mount the punched TAB chips on a substrate;
   a first cover to enclose the mounter;
   a second cover to enclose the punching die; and
   an exhaust to exhaust air inside of the second cover.

5. An outer-lead bonding apparatus of claim 4, wherein said mounter comprises:

a take-out head to take TAB chips from an inside space of the first cover to an inside space of the second cover,
   a transfer table to transfer the TAB chips onto a substrate; and
   a pressure bonder to pressure bond the transferred TAB chips onto a substrate.

6. An outer-lead bonding apparatus of claim 4, wherein said mounter comprises:

a mover to move a lower die of the punching means back and forth between the inside spaces of the first and second covering means;
   a transferor at the inside of the second cover to transfer the TAB chips in a lower die of the punching die which is moved to an inside of the second cover from the inside of the first cover; and
   a pressure bonder to pressure bond the transferred TAB chips onto a substrate.

7. An outer-lead bonding apparatus comprising:

a punching die to stamp out chips from a film carrier tape;
   a mounter to mount the punched TAB chips on a substrate;
   a first cover to enclose the mounter;
   a second cover to enclose the punching die; and
   a pressure regulator to supply higher pressurized air to an inside space of the first cover than that outside the first cover; and
   an exhaust means to exhaust air inside of the second cover.

8. A method of bonding punched chips on a substrate comprising the steps of:

enclosing a TAB chip mounter within a first cover;
   enclosing a punching die for stamping TAB chips from a film carrier within a second cover;
   supplying air of a higher pressure than air on the outside of the first cover to the inside of the first cover; and
   exhausting air from the inside of the second cover.

* * * * *